(12) United States Patent
Xia et al.

(10) Patent No.: US 7,068,513 B1
(45) Date of Patent: Jun. 27, 2006

(54) FIXING APPARATUS FOR MOUNTING A HEAT SINK TO A PRINTED CIRCUIT BOARD

(75) Inventors: Wan-Lin Xia, Shenzhen (CN); Tao Li, Shenzhen (CN); Yong Zhong, Shenzhen (CN); Jun Long, Shenzhen (CN)

(73) Assignee: Foxconn Technology Co., Ltd., Tu-Cheng (TW)

( * ) Notice: Subject to any disclaimer, the term of this patent is extended or adjusted under 35 U.S.C. 154(b) by 0 days.

(21) Appl. No.: 11/244,586

(22) Filed: Oct. 5, 2005

(51) Int. Cl.
*H05K 7/20* (2006.01)

(52) U.S. Cl. .................................... 361/704
(58) Field of Classification Search ................ 439/73; 361/704, 709, 910, 719
See application file for complete search history.

(56) References Cited

U.S. PATENT DOCUMENTS

| | | | |
|---|---|---|---|
| 5,109,453 A * | 4/1992 | Edwards et al. .............. | 385/90 |
| 5,662,163 A | 9/1997 | Mira | |
| 5,847,928 A * | 12/1998 | Hinshaw et al. ............ | 361/704 |
| 6,307,747 B1 | 10/2001 | Farnsworth et al. | |
| 6,412,546 B1 * | 7/2002 | Lin et al. .................... | 165/80.3 |
| 6,538,893 B1 * | 3/2003 | Hsu ........................... | 361/719 |
| 6,549,412 B1 | 4/2003 | Ma | |
| 6,646,881 B1 | 11/2003 | Lai et al. | |
| 6,654,254 B1 * | 11/2003 | Szu et al. .................... | 361/760 |
| 6,684,476 B1 * | 2/2004 | Yu .............................. | 29/428 |
| 6,885,557 B1 | 4/2005 | Unrein | |
| 2004/0017662 A1 | 1/2004 | Liu | |
| 2005/0111190 A1 | 5/2005 | Wang et al. | |

* cited by examiner

*Primary Examiner*—Neil Abrams
(74) *Attorney, Agent, or Firm*—Morris, Manning & Martin; Tim Tingkang Xia, Esq.

(57) ABSTRACT

A fixing apparatus includes a retention module (10) and a back plate (30). The retention module is attached on a printed circuit board (20), which defines a plurality of through apertures (22). The retention module comprises a plurality of posts (12) depending therefrom. Each post is hollow and aligned with a corresponding through aperture. The back plate is attached on a bottom surface of the printed circuit board, for reinforcing the printed circuit board. The back plate comprises a plurality of upwardly extending poles (32). The poles extend through the through apertures and lock inside of the posts to secure the retention module and the back plate on opposites sides of the printed circuit board.

12 Claims, 7 Drawing Sheets

FIXING APPARATUS FOR MOUNTING A HEAT SINK TO A PRINTED CIRCUIT BOARD

BACKGROUND

1. Field

The present invention generally relates to a fixing apparatus, and particularly relates to a fixing apparatus having a retention module and a back plate engaged with the retention module so that the retention module and the back plate are both secured on a printed circuit board whereby a heat sink attached to the retention module can be securely mounted on the printed circuit board.

2. Related Art

With advancement of computer technology, electronic devices operate with high speeds. It is well known that the more rapidly the electronic devices operate, the more heat they generate. If the heat is not dissipated duly, the stability of the operation of the electronic devices will be impacted severely.

Generally, in order to ensure the electronic device to run normally, a heat sink is used to dissipate the heat generated by the electronic device. And in order to facilitate installation of the heat sink to the electronic device, a retention module is employed. Commonly, the retention module is mounted onto a printed circuit board and is around the electronic device. One the other hand, to enhance the strength of the printed circuit board, a back plate is applied underneath the printed circuit board. An example of a combination comprising a retention module and a back plate both secured to a printed circuit board, is taught in U.S. Pat. No. 6,549,412B1. In this patent, the retention module forms four downward posts adjacent four corners thereof. A heat sink (not shown) is to be fixed to the retention module. Each post defines a through hole therein. The back plate comprises four poles corresponding to the through holes of the retention module. In assembly, the poles extend through the printed circuit board and the through holes of the retention module, and further protrude from a top surface of the retention module. The protruded portions of the poles are stamped to thereby form rivet joints between the retention module and the back plate. Thus, the retention module and the back plate are attached on opposite sides of the printed circuit board, whereby the heat sink fixed on the retention module is secured to the printed circuit board to thermally contact with a CPU (not shown) mounted on the printed circuit board and surrounded by the retention module.

Free ends of the poles of the '412 patent are stamped after the retention module and the back plate are placed to the printed circuit board. That is to say, the printed circuit board is placed in a situation subjected to stamping procedure, with the retention module and the back plate. The printed circuit board is thus at the risk of being damaged under stamping force or huge vibration during stamping the poles. Additionally, stamping the free ends of the poles increases the assembly cost.

It is strongly desired to provide an improved heat sink fixing apparatus which overcomes the above problem.

SUMMARY

What is needed is a fixing apparatus having a retention module and a back plate wherein the retention module and the back plate are mounted to a printed circuit board simultaneously and expediently by an engagement of the retention module and the back plate. The retention module is for carrying a heat sink so that when the retention module and the back plate are mounted to the printed circuit board, the heat sink carried by the retention module can have an intimate contact with a heat-generating electronic device mounted on the printed circuit board and surrounded by the retention module.

A fixing apparatus in accordance with a preferred embodiment of the present invention comprises a retention module and a back plate. The retention module is attached on a printed circuit board that defines a plurality of through apertures therein. The retention module comprises a plurality of posts depending therefrom. Each post is aligned with a corresponding through aperture and defines a pair of support portions on an inner wall thereof. The back plate is attached on an underside of the printed circuit board, for reinforcing the printed circuit board and securing the retention module on the printed circuit board. The back plate comprises a plurality of poles extending upwardly from a periphery thereof. The poles are extended through the through apertures and inserted in the posts. Each pole locks in a corresponding post by engaging with the support portions to render the retention module and the back plate to be mounted to the printed circuit board.

Other advantages and novel features of the invention will become more apparent from the following detailed description when taken in conjunction with the accompanying drawings, in which:

DETAILED DESCRIPTION OF THE EMBODIMENT

Reference will now be made to the drawings to describe embodiment of the present invention in detail.

Figure 1:
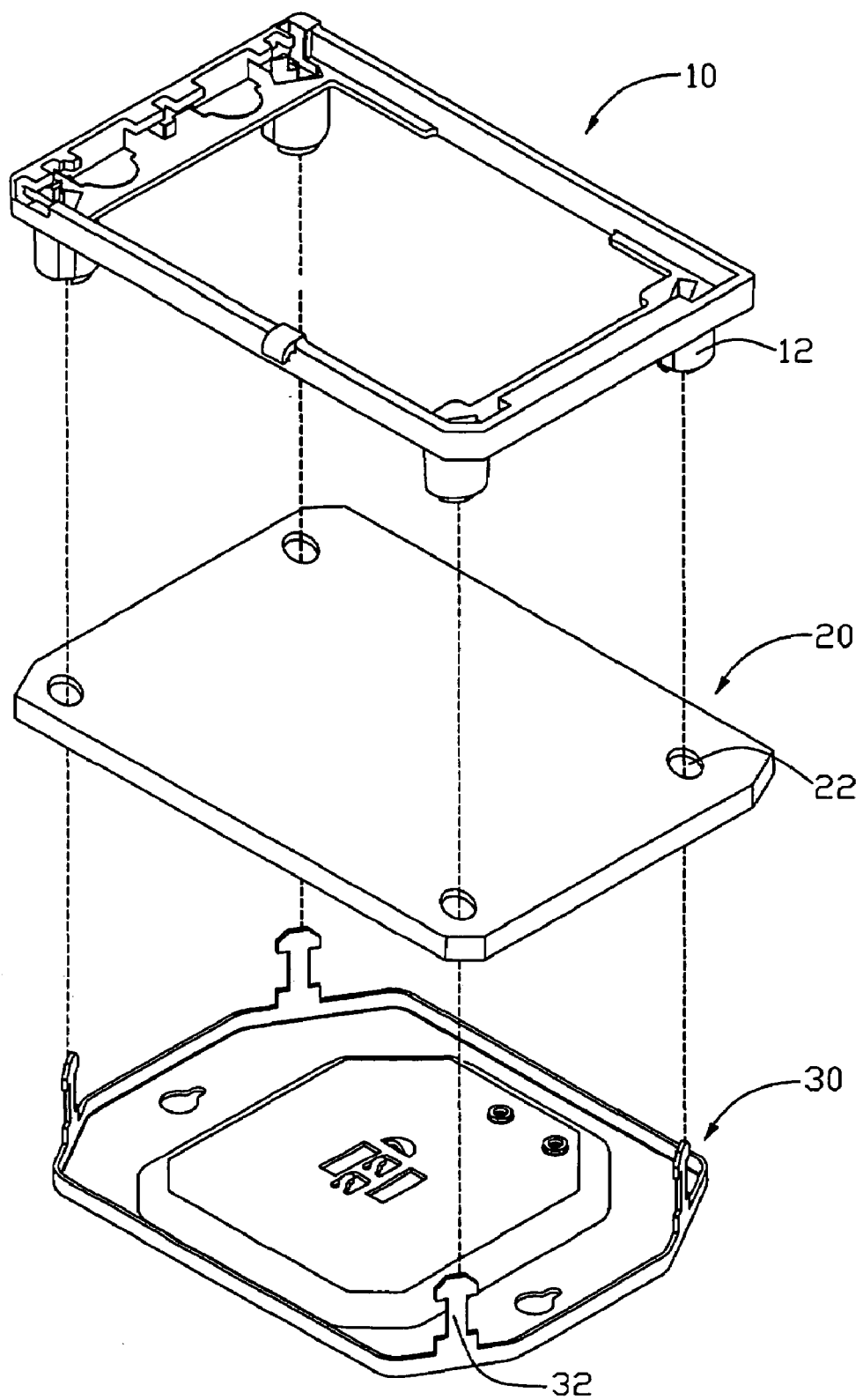
FIG. 1 is an exploded, isometric view of a heat sink fixing apparatus in accordance with a preferred embodiment of the present invention and a printed circuit board, the fixing apparatus comprising a retention module with posts thereon and a back plate.
Figure 2:
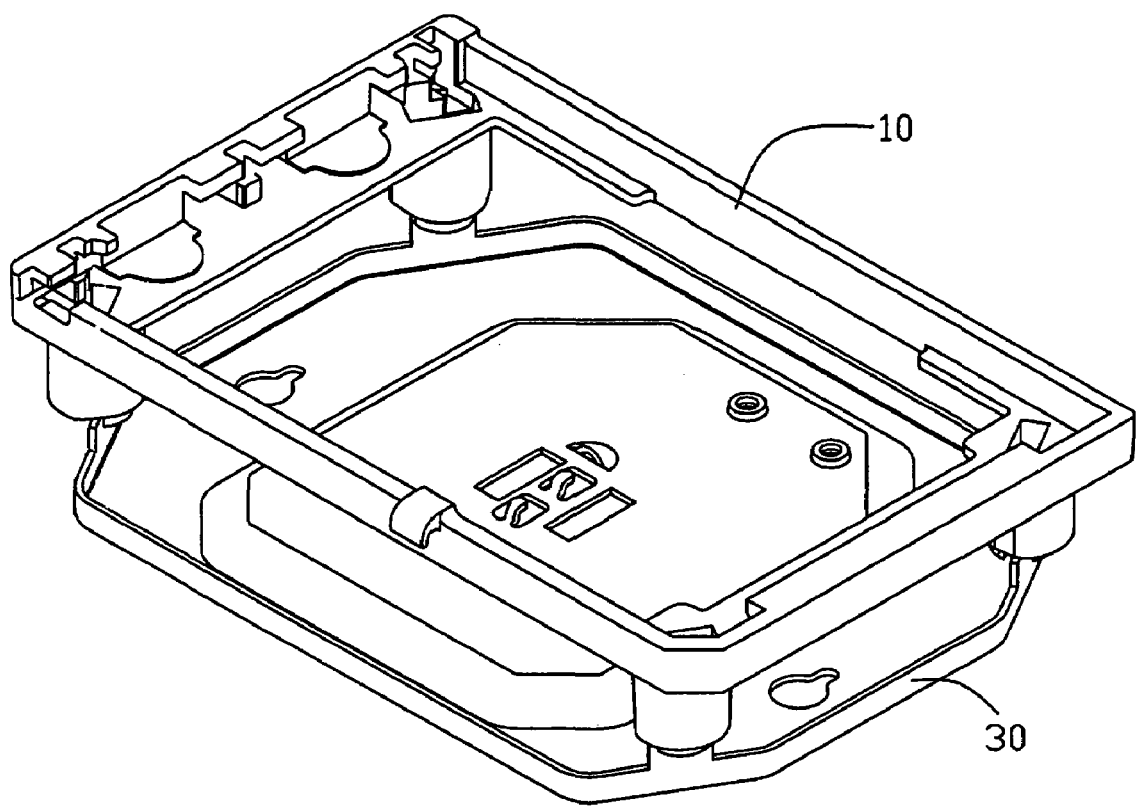
FIG. 2 is an assembled view of the fixing apparatus of FIG. 1 without the printed circuit board.

FIG. 1 illustrates a heat sink fixing apparatus in accordance with a preferred embodiment of the present invention, together with a printed circuit board 20. The printed circuit board 20 defines four through apertures 22 therein. The fixing apparatus comprises a retention module 10 and a back plate 30. The retention module 10 cooperates with the back plate 30 to sandwich the printed circuit board 20 therebetween. Referring to FIG. 2, the back plate 30 is engaged with the retention module 10 so that the retention module 10 and the back plate 30 are secured together.

Figure 3:
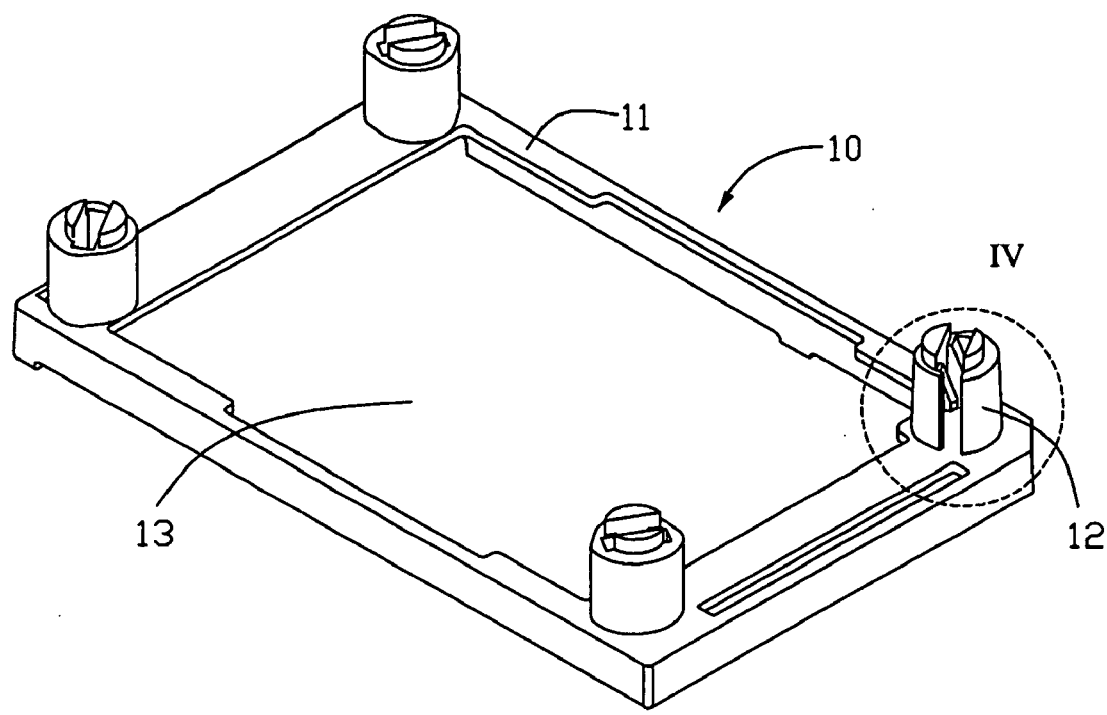
FIG. 3 is an enlarged bottom view of the retention module of the fixing apparatus of FIG. 1, with a part being cut away.
Figure 4:
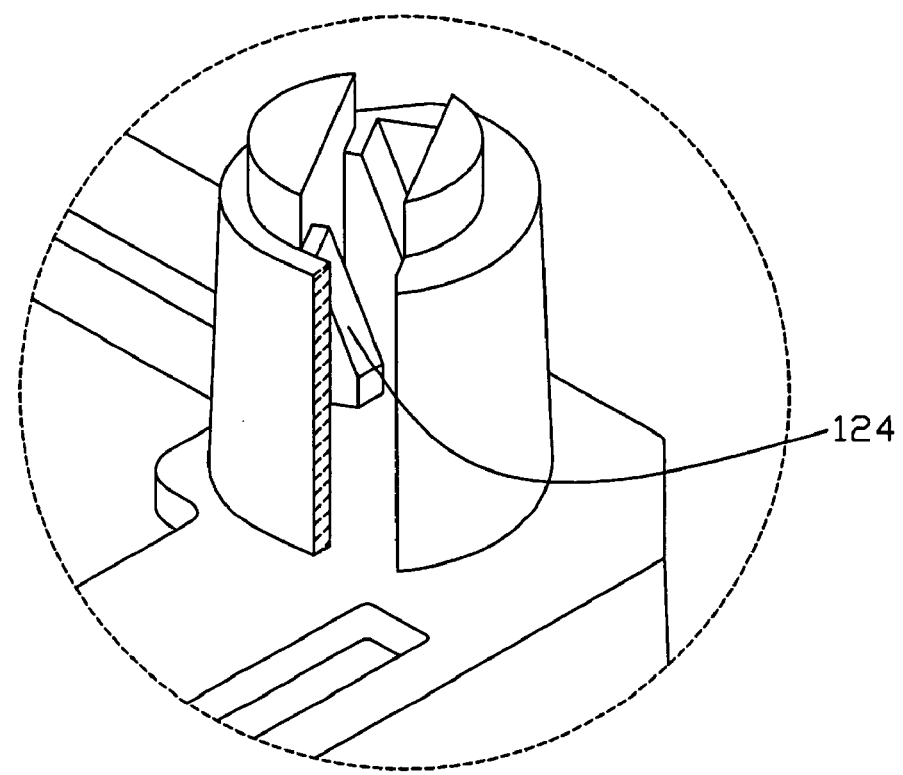
FIG. 4 is an enlarged view of an indicated portion IV of FIG. 3.
Figure 7:
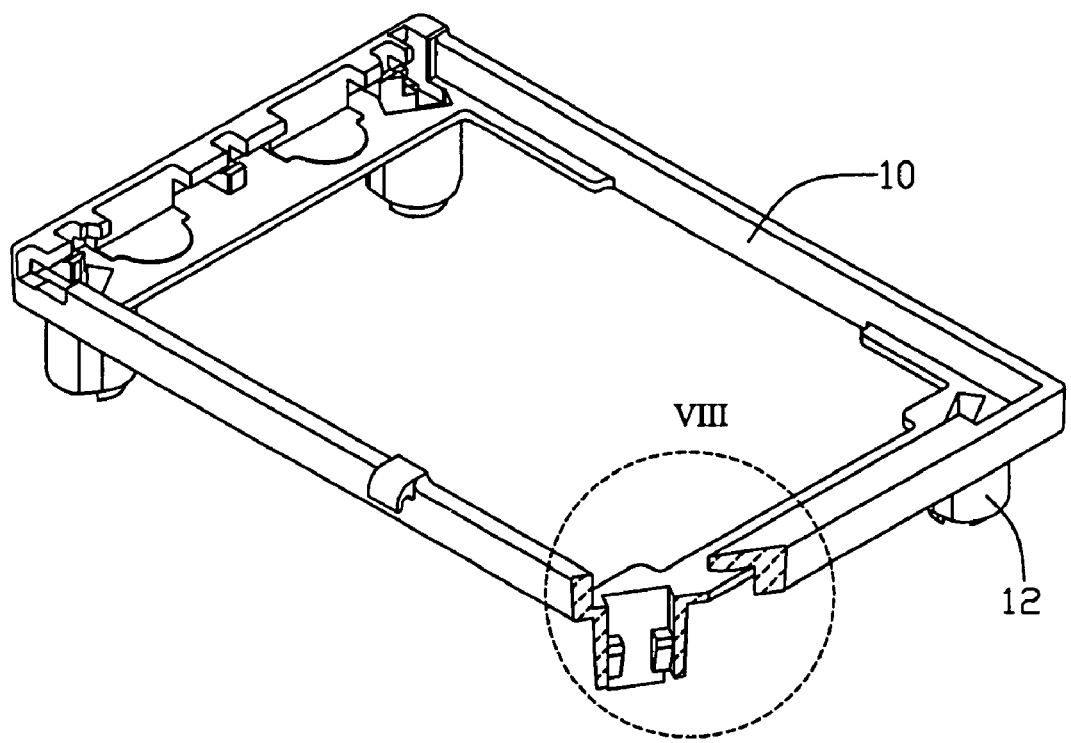
FIG. 7 is an enlarged view of the retention module of the fixing apparatus of FIG. 1, with a part being cut away to more clearly show an inner configuration of one of the posts.
Figure 8:
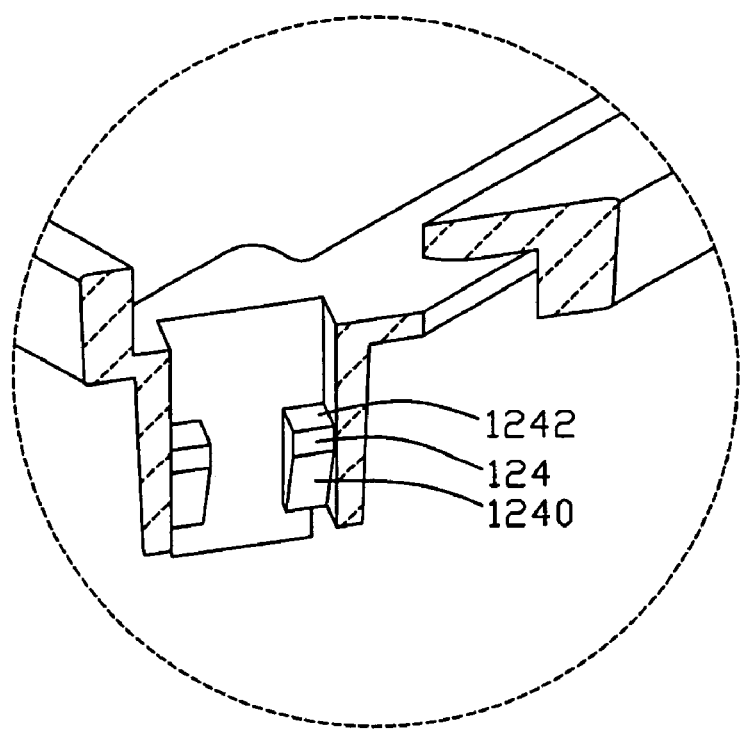
FIG. 8 is an enlarged view of an indicated portion VIII of FIG. 7.

The retention module 10 is for attaching on a top surface of the printed circuit board 20 and thereby enabling a heat sink (not shown) retained by the retention module 10 to contact with an electronic component (not shown) mounted on the top surface of the printed circuit board 20 and surrounded by the retention module 10. Referring to FIGS. 3–4, the retention module 10 comprises a base 11, an opening 13 and four posts 12. The base 11 and the opening 13 each have a rectangular configuration. The opening 13 is defined in a center of the base 11. The four posts 12 respectively depend from four corners of the retention module 10, corresponding to the through apertures 22 of the printed circuit board 20. The posts 12 are hollow. A pair of support portions 124 is formed on an inner wall of each post 12. Each support portion 124 is configured as a triangle-shaped tab. The support portions 124 are spaced from and parallel to each other. Each support portion 124 comprises an inclined plane 1240 and a horizontal platform 1242 as clearly shown in FIGS. 7–8. The platform 1242 is located at a top of the support portion 124. The inclined plane 1240 inclines outwardly along a direction from a bottom to the top of the support portion 124.

Figure 5:
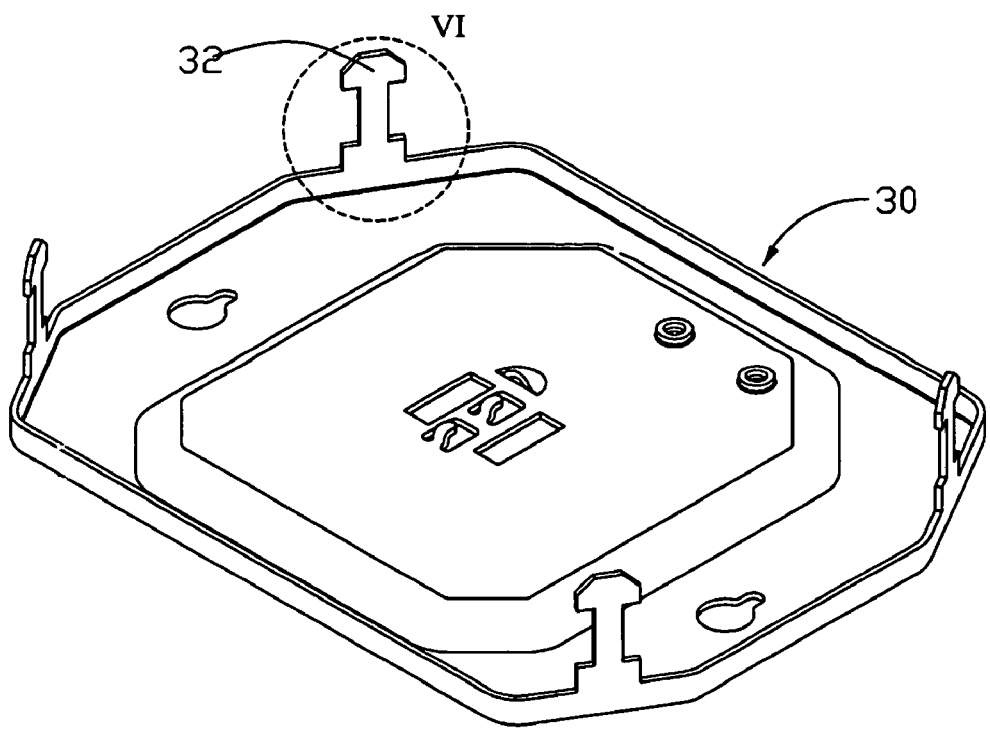
FIG. 5 is an enlarged view of the back plate of the fixing apparatus of FIG. 1.
Figure 6:
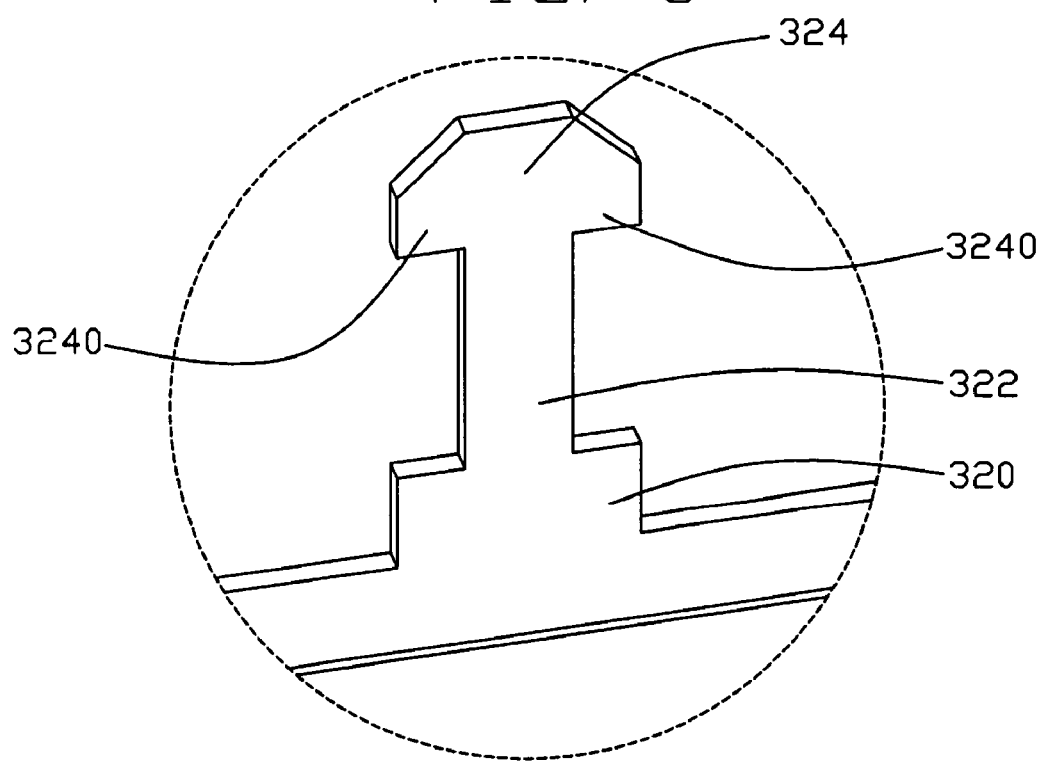
FIG. 6 is an enlarged view of an indicated portion VI of FIG. 5.

The back plate 30 is for attaching on a bottom surface of the printed circuit board 20 thereby reinforcing the printed circuit board 20. Referring to FIGS. 5–6, the back plate 30 comprises four poles 32 extending upwardly from four corners of a periphery of the back plate 30, corresponding to the through apertures 22 of the printed circuit board 20 and the posts 12. Each pole 32 comprises a seat 320 extending from an edge of the back plate 30, a shaft 322 extending from the seat 320 and a hook 324 extending from the shaft 322. The hook 324 further comprises a pair of arms 3240 formed at opposite ends of the hook 324.

Figure 9:
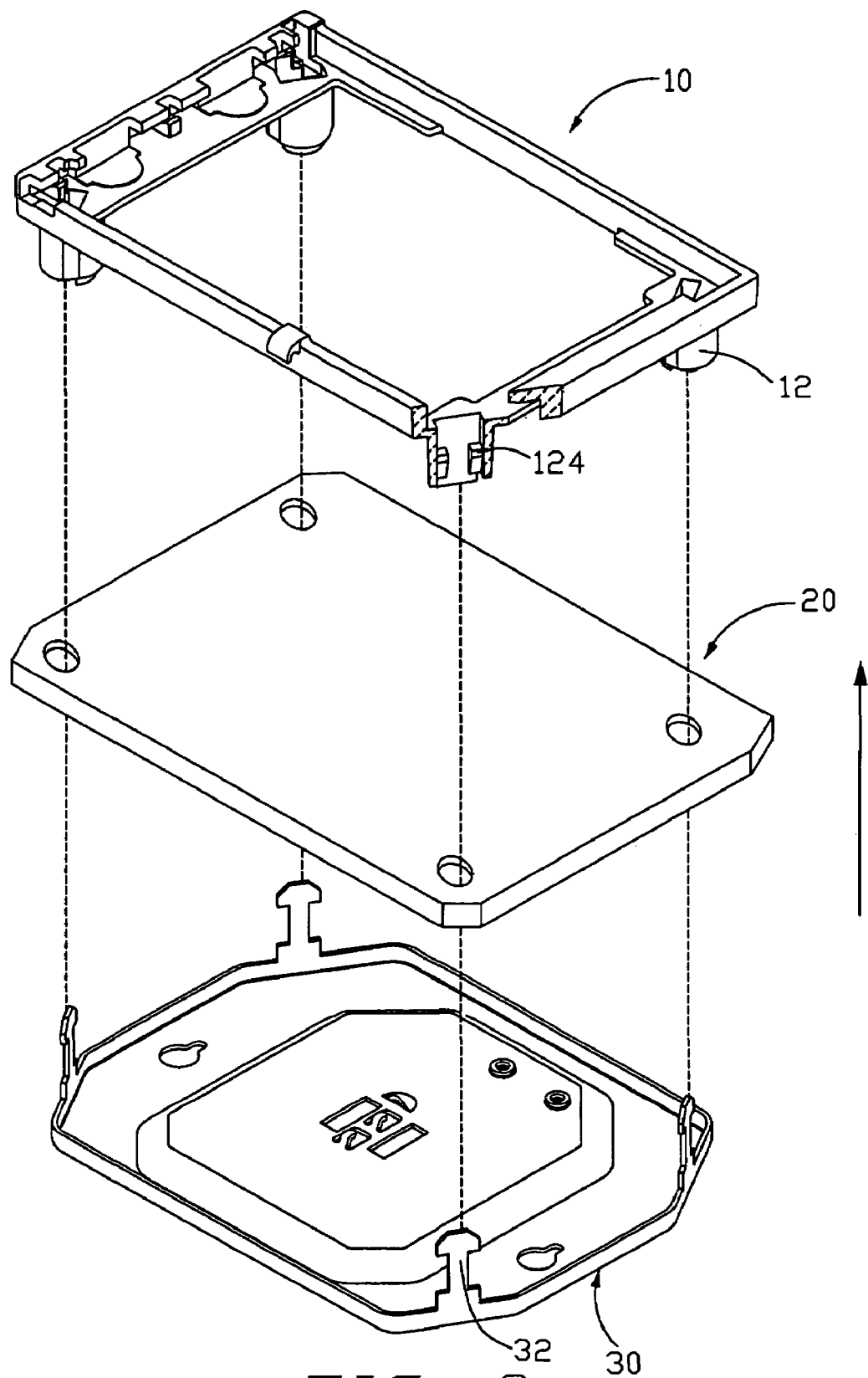
FIG. 9 is a view similar to FIG. 1, but with a part of the retention module being cut away and an arrow being added to indicate a direction that the back plate is moved to attach on a bottom surface of the printed circuit board.
Figure 10:
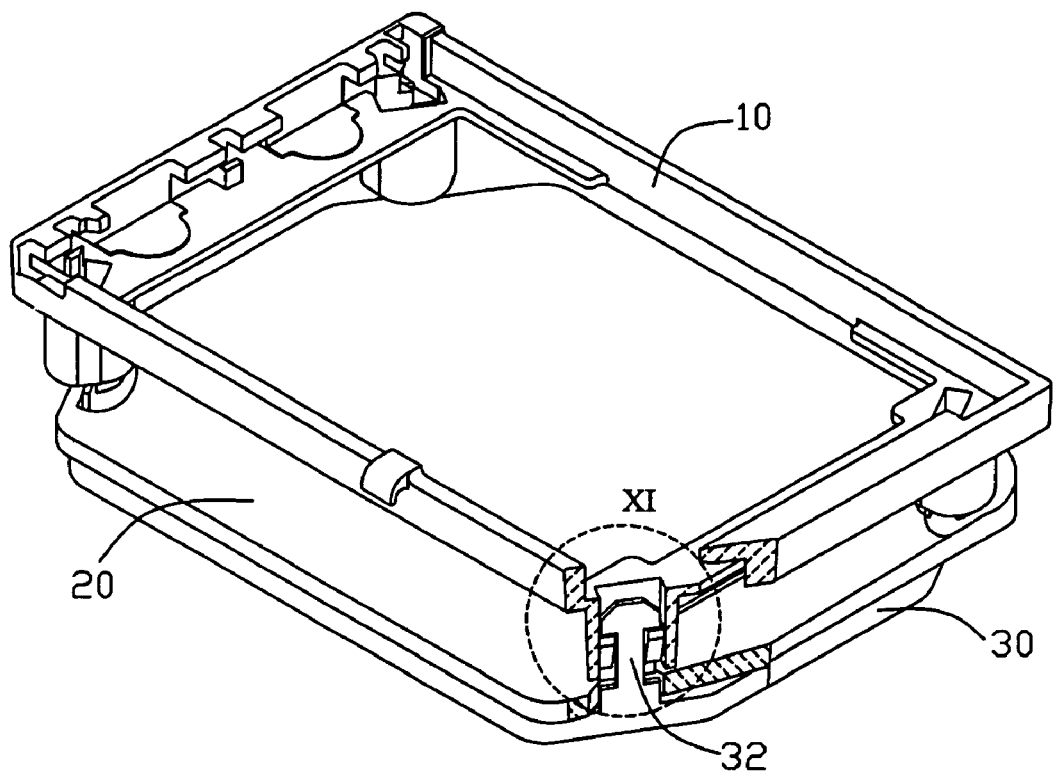
FIG. 10 is an assembled view of FIG. 9.
Figure 11:
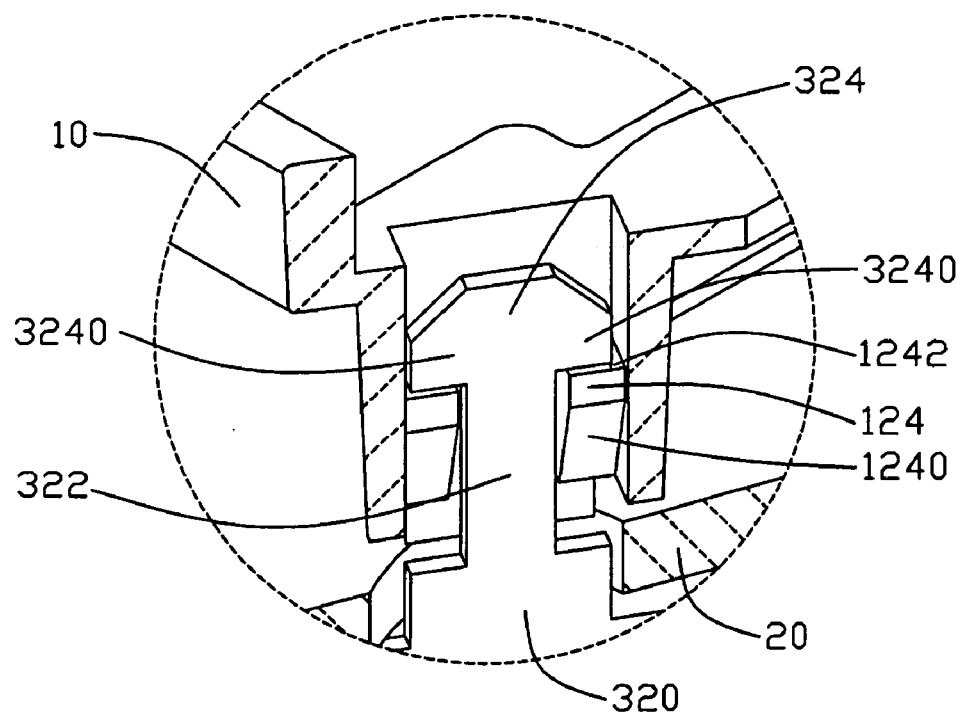
FIG. 11 is an enlarged view of an indicated portion XI of FIG. 10.

Referring to FIGS. 9–11, in assembly, the back plate 30 is attached onto the bottom surface of the printed circuit board 20. The poles 32 of the back plate 30 are extended through the through apertures 22 of the printed circuit board 20. The seats 320 are received in the through apertures 22 of the printed circuit board 20 and the shafts 322 and the hooks 324 are extended upwardly beyond the printed circuit board 20. The retention module 10 is then attached to the top surface of the printed circuit board 20. The posts 12 are aligned with the through apertures 22 of the printed circuit board 20 to allow the hooks 324 of the poles 32 inserted insides of the posts 12. The retention module 10 is pressed toward the printed circuit board 20. The arms 3240 of the hooks 324 are rendered to slide along the inclined planes 1240 and the shafts 322 moves upwardly between the support portions 124, respectively, until the arms 3240 of the hooks 324 reach a position engaging the platforms 1242 so that the poles 32 of the back plate 30 are locked in the posts 12 of the retention module 10, as particularly clearly shown in FIGS. 10–11. The shaft 322 of each pole 32 is thus received between the support portions 124 of the corresponding post 12. The posts 12 are engagingly rested on the printed circuit board 20. The retention module 10 and the back plate 30 therefore are attached on opposite sides of the printed circuit board 20.

In this invention, the retention module 10 and the back plate 30 are simultaneously secured to the printed circuit board 20 by the poles 32 locked inside of the posts 12. This is a very fast and simple operation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat sink fixing apparatus comprising:
   a printed circuit board defining a plurality of through apertures therein;
   a back plate attached on a bottom surface of the printed circuit board, the back plate comprising a plurality of poles corresponding to the through apertures; and
   a retention module for carrying a heat sink thereon, the retention module being attached on a top surface of the circuit board, the retention module comprising a plurality of pairs of support portions corresponding to the poles and the through apertures respectively;
   wherein the poles extend through the through apertures and engage the support portions to render the back plate and the retention module to be secured on the printed circuit board, and wherein each of the support portions has an upper horizontal platform with which a corresponding pole engages, and a lower inclined plane inclining outwardly along a bottom to top direction of the retention module; and
   wherein the retention module comprises a plurality of hollow posts depending therefrom, and the support portions are formed on inner walls of the posts.

2. The fixing apparatus as claimed in claim 1, wherein the posts extend from four corners of the retention module.

3. The fixing apparatus as claimed in claim 2, wherein each of the each pair of the support portions has a triangle-shaped configuration and is spaced from and parallel to each other.

4. The fixing apparatus as claimed in claim 1, wherein each pole comprises a pair of arms engaging with the upper horizontal platforms of corresponding support portions to render the pole locked inside of the posts.

5. A fixing apparatus for securing on opposite sides of a printed circuit board, the fixing apparatus comprising:
   a back plate for attaching on a bottom surface of the printed circuit board, the back plate comprising a plurality of poles for extending through the printed circuit board, each pole comprising a plurality of arms; and
   a retention module for attaching on a top surface of the printed circuit board, the retention module being adapted for carrying a heat sink thereon, and comprising a plurality of posts corresponding to the poles, each post comprising a plurality of support portions therein;
   wherein each of the support portions has a triangle configuration with an upper platform that a corresponding arm engages, and a lower inclined plane inclining outwardly along a bottom-to-top direction of the retention module, and wherein the poles are respectively inserted in the posts and the arms of the poles are engaged with the support portions in the posts.

6. The fixing apparatus as claimed in claim 5, wherein the posts extend from four corners of the retention module respectively corresponding to the poles.

7. The fixing apparatus as claimed in claim 5, wherein the poles extend upwardly from a periphery of the back plate respectively corresponding to the posts.

8. The fixing apparatus as claimed in claim 5, wherein each pole comprises a hook, the arms being located at opposite sides of the hook.

9. The fixing apparatus as claimed in claim 8, wherein each support portion comprises an upper horizontal platform and a lower inclining plane, the arms being engaged with the horizontal platforms.

10. A method for assembling a retention module and a back plate to a printed circuit board, the retention module being for carrying a heat sink thereon and having a plurality of downwardly extending posts therein, the printed circuit board having a plurality of apertures, and the back plate having a plurality of upwardly extending poles each having a hook on a top thereof, the assembling method comprising inserting the poles from a bottom surface the printed circuit board through the apertures into the posts until the hooks engage with the posts at insides of the posts so that the poles are locked with the posts, the retention module is securely mounted on a top surface of the printed circuit board and the back plate is securely attached to the bottom surface of the printed circuit board;

wherein each post forms at least a support portion therein, the at least a support portion having a lower inclined plane and a horizontal top platform, during the insertion of the poles in the posts, the hooks first sliding on the inclined planes, respectively, and then engaging the horizontal platforms when the poles are locked with the posts.

11. The method as claimed in claim 10, wherein each of the poles has a seat, a shaft extending from the seat, the hook being formed on a top of the shaft, the seats engaging in the apertures, respectively, when the poles are locked with the posts.

12. The method as claimed in claim 11, wherein each post forms a pair of support portions therein, the shaft is located between the support portions.

* * * * *